United States Patent
Chen et al.

(10) Patent No.: US 10,964,788 B1
(45) Date of Patent: Mar. 30, 2021

(54) SEMICONDUCTOR DEVICE AND OPERATING METHOD THEREOF

(71) Applicant: Vanguard International Semiconductor Corporation, Hsinchu (TW)

(72) Inventors: Chih-Yen Chen, Tainan (TW); Chia-Ching Huang, Taoyuan (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 8 days.

(21) Appl. No.: 16/697,664

(22) Filed: Nov. 27, 2019

(51) Int. Cl.
| | |
|---|---|
| *H01L 29/40* | (2006.01) |
| *H01L 29/417* | (2006.01) |
| *H01L 29/08* | (2006.01) |
| *H01L 29/778* | (2006.01) |
| *H01L 21/3213* | (2006.01) |
| *H01L 29/66* | (2006.01) |

(Continued)

(52) U.S. Cl.
CPC ........ *H01L 29/402* (2013.01); *H01L 21/0254* (2013.01); *H01L 21/32133* (2013.01); *H01L 23/552* (2013.01); *H01L 29/0843* (2013.01); *H01L 29/2003* (2013.01); *H01L 29/205* (2013.01); *H01L 29/41775* (2013.01); *H01L 29/66462* (2013.01); *H01L 29/7786* (2013.01)

(58) Field of Classification Search
CPC ......... H01L 29/66696; H01L 29/41775; H01L 29/402
See application file for complete search history.

(56) References Cited

U.S. PATENT DOCUMENTS

2012/0018735 A1* 1/2012 Ishii ..................... H01L 29/7787
257/76
2015/0028384 A1* 1/2015 Cao ..................... H01L 27/0605
257/140

(Continued)

FOREIGN PATENT DOCUMENTS

| TW | 182075 | 4/1992 |
| TW | 201409610 A | 3/2014 |

(Continued)

OTHER PUBLICATIONS

Taiwanese Office Action and Search Report dated Jul. 31, 2020 for Application No. 108125151.

*Primary Examiner* — Mohammed R Alam
(74) *Attorney, Agent, or Firm* — Birch, Stewart, Kolasch & Birch, LLP

(57) ABSTRACT

A semiconductor device includes a semiconductor layer, a gate electrode disposed on the semiconductor layer, a first dielectric layer disposed on the semiconductor layer and the gate electrode, a source field plate disposed on the semiconductor layer and the first dielectric layer, a second dielectric layer disposed on the source field plate, and a source electrode disposed on the second dielectric layer and electrically connected to the source field plate. The gate electrode has a first sidewall and a second sidewall respectively disposed on the first side and the second side. The source field plate extends from the first side to the second side. A portion of the source field plate is disposed to correspond to the second sidewall. The semiconductor device further includes a third dielectric layer disposed on the source electrode and a drain structure disposed on the second side.

20 Claims, 5 Drawing Sheets

(51) Int. Cl.
*H01L 29/20* (2006.01)
*H01L 29/205* (2006.01)
*H01L 21/02* (2006.01)
*H01L 23/552* (2006.01)

(56) References Cited

U.S. PATENT DOCUMENTS

2017/0352731 A1  12/2017  Kuo et al.
2018/0219093 A1   8/2018  Chou et al.

FOREIGN PATENT DOCUMENTS

| TW | 201838178 A | 10/2018 |
| TW | 201926701 A | 7/2019 |

* cited by examiner

SEMICONDUCTOR DEVICE AND OPERATING METHOD THEREOF

BACKGROUND

Technical Field

The embodiments of the present disclosure relate to semiconductor devices, and in particular they relate to semiconductor devices used for high electron mobility transistors (HEMT) and operating methods of the same.

Description of the Related Art

In the semiconductor industry, Group III-V compounds (e.g., gallium nitride (GaN)) are often used to form various integrated circuit (IC) components due to their characteristics, such as high electron mobility transistors (HEMT). High electron mobility transistors are also referred to as heterojunction FETs (HFET) or modulation-doped FETs (MODFET), which include semiconductor materials having different energy gaps. A two-dimensional electron gas (2 DEG) layer may be generated at the interface formed by adjacent semiconductor materials. Due to the high electron mobility of the two-dimensional electron gas, the high electron mobility transistors may have high breakdown voltage, high electron mobility and low input capacitance, so they are suitable for high power components.

Although existing high electron mobility transistors generally meet requirements, they are still not satisfactory in every respect, however. Therefore, further improvements are needed to improve the performance and extend to a wider range of applications.

BRIEF SUMMARY

In accordance with some embodiments of the present disclosure, a semiconductor device is provided. The semiconductor device includes a semiconductor layer. The semiconductor device also includes a gate electrode disposed on the semiconductor layer. The gate electrode has a first sidewall and a second sidewall respectively disposed on the first side and the second side of the gate electrode. The semiconductor device further includes a first dielectric layer disposed on the semiconductor layer and the gate electrode. The semiconductor device includes a source field plate disposed on the semiconductor layer and the first dielectric layer. The source field plate extends from the first side to the second side of the gate electrode and a portion of the source field plate is disposed to correspond to the second sidewall. The semiconductor device also includes a second dielectric layer disposed on the source field plate. The semiconductor device further includes a source electrode disposed on the second dielectric layer and electrically connected to the source field plate. The semiconductor device includes a third dielectric layer disposed on the source electrode. The semiconductor device also includes a drain structure disposed on the second side of the gate electrode.

In accordance with some embodiments of the present disclosure, a semiconductor device is provided. The semiconductor device includes a semiconductor layer. The semiconductor device also includes a gate electrode disposed on the semiconductor layer. The gate electrode has a first sidewall and a second sidewall respectively disposed on the first side and the second side of the gate electrode. The semiconductor device further includes a first dielectric layer disposed on the semiconductor layer and the gate electrode. The semiconductor device includes a source field plate having a first body portion and a first extending portion. The first body portion is disposed on the first side of the gate electrode, the first extending portion is disposed on the first dielectric layer and connected to the first body portion, the first extending portion extends from a top portion of the gate electrode to the second side of the gate electrode, and a portion of the first extending portion is disposed to correspond to the second sidewall. The semiconductor device also includes a second dielectric layer disposed on the source field plate. The semiconductor device further includes a source electrode disposed on the second dielectric layer and electrically connected to the source field plate. The semiconductor device includes a third dielectric layer disposed on the source electrode. The semiconductor device also includes a drain structure disposed on the second side of the gate electrode.

In accordance with some embodiments of the present disclosure, an operating method of a semiconductor device is provided. The semiconductor device includes a semiconductor layer. The semiconductor device also includes a gate electrode disposed on the semiconductor layer. The gate electrode has a first sidewall and a second sidewall respectively disposed on the first side and the second side of the gate electrode. The semiconductor device further includes a first dielectric layer disposed on the semiconductor layer and the gate electrode. The semiconductor device includes a source field plate disposed on the semiconductor layer and the first dielectric layer. The source field plate extends from the first side to the second side of the gate electrode and a portion of the source field plate is disposed to correspond to the second sidewall. The semiconductor device also includes a second dielectric layer disposed on the source field plate. The semiconductor device further includes a source electrode disposed on the second dielectric layer and electrically connected to the source field plate. The semiconductor device includes a third dielectric layer disposed on the source electrode. The semiconductor device also includes a drain structure disposed on the second side of the gate electrode. The operating method of the semiconductor device includes applying a voltage of 0V or less to the gate electrode when the semiconductor device is in an off state.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

DETAILED DESCRIPTION

Figure 1:
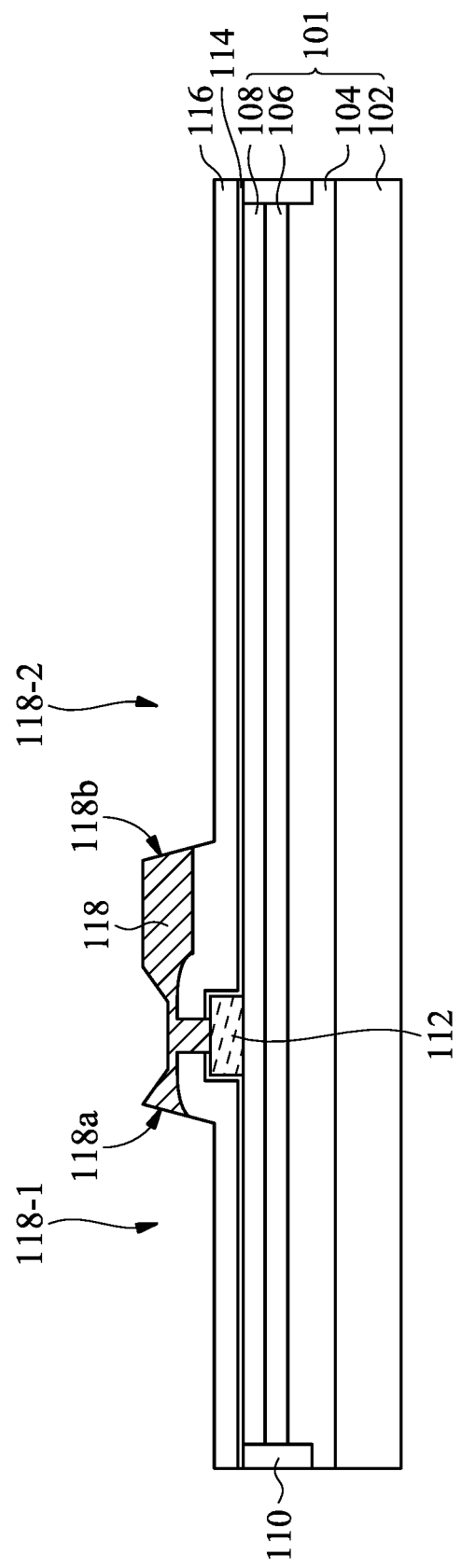
FIG. 1 is a cross-sectional view illustrating the semiconductor device at one stage of manufacture in accordance with some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

According to some embodiments of the present disclosure, semiconductor devices are provided, and in particular they may be used for high electron mobility transistor (HEMT) devices. In some embodiments, the source field plate, the source electrode or the source contact of the semiconductor device may respectively have extending portions. The extending portions may extend between the gate electrode and the drain structure, which may effectively shield the electric field from electromagnetic interference (EMI) and improve the problem of charge trapping.

FIG. 1 to FIG. 5 are cross-sectional views illustrating the semiconductor device 100 at various stages of manufacture in accordance with some embodiments of the present disclosure. As shown in FIG. 1, the semiconductor device 100 includes a substrate 102. In some embodiments, the substrate 102 may be a bulk semiconductor substrate or include a composite substrate formed of different materials, and the substrate 102 may be doped (for example, using p-type or n-type dopants) or undoped. In some embodiments, the substrate 102 may include a semiconductor substrate, a glass substrate, or a ceramic substrate, such as a silicon substrate, a silicon germanium substrate, a silicon carbide, an aluminum nitride substrate, a sapphire substrate, the like, or a combination thereof, but the present disclosure is not limited thereto. In some embodiments, the substrate 102 may include a semiconductor-on-insulator (SOI) substrate formed by disposing a semiconductor material on an insulating layer.

As shown in FIG. 1, a buffer layer 104 may be formed over the substrate 102 to relieve the lattice mismatch between the substrate 102 and the layer(s) on the buffer layer 104, and improve the crystalline quality. In some embodiments, the buffer layer 104 may include a group III-V compound semiconductor material, such as a group III nitride. For example, the buffer layer 104 may include gallium nitride (GaN), aluminum nitride (AlN), aluminum gallium nitride (AlGaN), aluminum indium nitride (AlInN), the like, or a combination thereof, but the present disclosure is not limited thereto. In some embodiments, the buffer layer 104 may be formed by a deposition process, such as chemical vapor deposition (CVD), atomic layer deposition (ALD), molecular beam epitaxy (MBE), liquid phase epitaxy (LPE), the like, or a combination thereof, but the present disclosure is not limited thereto.

In addition, although in the embodiment illustrated in FIG. 1, the buffer layer 104 is directly formed on the substrate 102, in other embodiments, a nucleation layer (not illustrated) may be formed on the substrate 102 before the buffer layer 104 is formed to further relieve the lattice mismatch between the buffer layer 104 and the substrate 102, and improve the crystal quality. In some embodiments, the nucleation layer may include a group III-V compound semiconductor material, such as a group III nitride.

As shown in FIG. 1, a channel layer 106 may be formed on the buffer layer 104. In some embodiments, the channel layer 106 may include one or more group III-V compound semiconductor materials, such as a group III nitride. In some embodiments, the material of the channel layer 106 may include, for example, GaN, AlGaN, InGaN, InAlGaN, the like, or a combination thereof. Further, the channel layer 106 may be doped or undoped. In some embodiments, the channel layer 106 may be formed by a deposition process, such as CVD, ALD, MBE, LPE, the like, or a combination thereof, but the present disclosure is not limited thereto.

As shown in FIG. 1, a barrier layer 108 may be formed on the channel layer 106 to create a two-dimensional electron gas (2DEG) at the interface between the channel layer 106 and the barrier layer 108. The barrier layer 108 may be formed by a deposition process, such as CVD, ALD, MBE, LPE, the like, or a combination thereof, but the present disclosure is not limited thereto. In some embodiments, the barrier layer 108 may include a group III-V compound semiconductor material, such as a group III nitride. For example, the barrier layer 108 may include AlN, AlGaN, AlInN, AlGaInN, the like, or a combination thereof, but the present disclosure is not limited thereto. The barrier layer 108 may include a single layer or a multilayer structure, and the barrier layer 108 may be doped or undoped. For simplicity, the substrate 102, the buffer layer 104, the channel layer 106, and the barrier layer 108 may be collectively referred to as a semiconductor layer 101.

As shown in FIG. 1, an isolation structure 110 may be provided. In some embodiments, a mask layer (not illustrated) may be disposed on the semiconductor layer 101, and then an etching process may be performed to etch the semiconductor layer 101 into a trench using the mask layer as an etch mask. For example, the mask layer may include a photoresist, such as a positive photoresist or a negative photoresist. In some embodiments, the mask layer may include a hard mask and may include silicon oxide ($SiO_2$), silicon nitride (SiN), silicon oxynitride (SiON), silicon carbide (SiC), silicon carbonitride (SiCN), the like, or a combination thereof, but the present disclosure is not limited thereto. The mask layer may be a single-layer structure or a multi-layer structure. The mask layer may be formed by a deposition process, a photolithography process, other suitable processes, or a combination thereof, but the present disclosure is not limited thereto. In some embodiments, the deposition process may include spin-on coating, CVD, ALD, the like, or a combination thereof. For example, the photolithography process may include photoresist coating (e.g., spin coating), soft baking, mask aligning, exposure, post-exposure baking (PEB), developing, rinsing, drying (e.g., hard baking), other suitable processes, or a combination thereof, but the present disclosure is not limited thereto.

In some embodiments, the etching process may include a dry etching process, a wet etching process, or a combination thereof. For example, the dry etching process may include reactive ion etch (RIE), inductively-coupled plasma (ICP) etching, neutral beam etching (NBE), electron cyclotron resonance (ERC) etching, the like, or a combination thereof, but the present disclosure is not limited thereto. For example, the wet etching process may use, for example, hydrofluoric acid (HF), ammonium hydroxide ($NH_4OH$), or any suitable etchant.

In some embodiments, an insulating material may be deposited in the trench to form the isolation structure 110. In some embodiments, the insulating material may be deposited by metal organic chemical vapor deposition (MOCVD), ALD, MBE, LPE, the like, or a combination thereof, but the present disclosure is not limited thereto. In some embodiments, the insulating material may include, for example, an oxide such as silicon oxide, a nitride such as silicon nitride, the like, or a combination thereof, but the present disclosure is not limited thereto.

As shown in FIG. 1, a compound semiconductor layer 112 may be disposed on the barrier layer 108 to vacate the 2DEG under a gate to achieve a normally-off state of the semiconductor device. In some embodiments, the material of the compound semiconductor layer 112 may formed on the barrier layer 108 by a deposition process. For example, the deposition process includes CVD, ALD, MBE, LPE, the like, or a combination thereof, but the present disclosure is not limited thereto. In some embodiments, the material of the compound semiconductor layer 112 may include n-type or p-type doped gallium nitride, and may be doped using a dopant.

In some embodiments, a patterning process may be performed to adjust the position of the compound semiconductor layer 112 according to a predetermined position of the gate. In some embodiments, the patterning process may include forming a mask layer (not illustrated) on the deposited material layer, then etching the portion of the deposited material layer that is not covered by the mask layer, and forming the compound semiconductor layer 112. The examples of materials and formation of the mask layer and the etching process are as described above, and will not be repeated again.

As shown in FIG. 1, a dielectric layer 114 may be conformally formed on the barrier layer 108, the isolation structure 110, and the compound semiconductor layer 112. In some embodiments, the dielectric layer 114 may include any suitable dielectric material, such as silicon oxide, silicon nitride, silicon oxynitride, low-κ dielectric material, aluminum oxide, aluminum nitride, the like, or a combination thereof, but the present disclosure is not limited thereto. In some embodiments, the dielectric layer 114 may be formed by a deposition process, such as a CVD process, an ALD process, a spin coating process, the like, or a combination thereof, but the present disclosure is not limited thereto.

As shown in FIG. 1, a dielectric layer 116 may be formed on the dielectric layer 114. In some embodiments, the material and formation of dielectric layer 116 may be selected from the materials and formation of dielectric layer 114 as described above, but the present disclosure is not limited thereto.

Then, in some embodiments, the dielectric layers 114 and 116 may be patterned to etch openings in the dielectric layers 114 and 116. The example of the patterning process is as described above, and will not be described again. Then, in some embodiments, a gate electrode 118 may be formed on the dielectric layer 116 and in the opening. In some embodiments, the material of the gate electrode 118 may include a conductive material, such as metal, metal silicide, the like, or a combination thereof, but the present disclosure is not limited thereto. For example, the metal may be gold (Au), nickel (Ni), platinum (Pt), palladium (Pd), iridium (Ir), titanium (Ti), chromium (Cr), tungsten (W), aluminum (Al), copper (Cu), the like, an alloy thereof, or a combination thereof, but the present disclosure is not limited thereto. In some embodiments, the gate electrode 118 may be formed by physical vapor deposition (PVD), CVD, ALD, evaporation, sputtering, the like, or a combination thereof, but the present disclosure is not limited thereto.

Then, in some embodiments, the gate electrode 118 may be patterned. The example of the patterning process is as described above, and will not be repeated again. As illustrated in FIG. 1, the gate electrode 118 is disposed on the semiconductor layer 101, and after the patterning process, the gate electrode 118 may have a first sidewall 118a and a second sidewall 118b respectively disposed on the first side 118-1 and the second side 118-2 of the gate electrode, in accordance with some embodiments.

Figure 2:
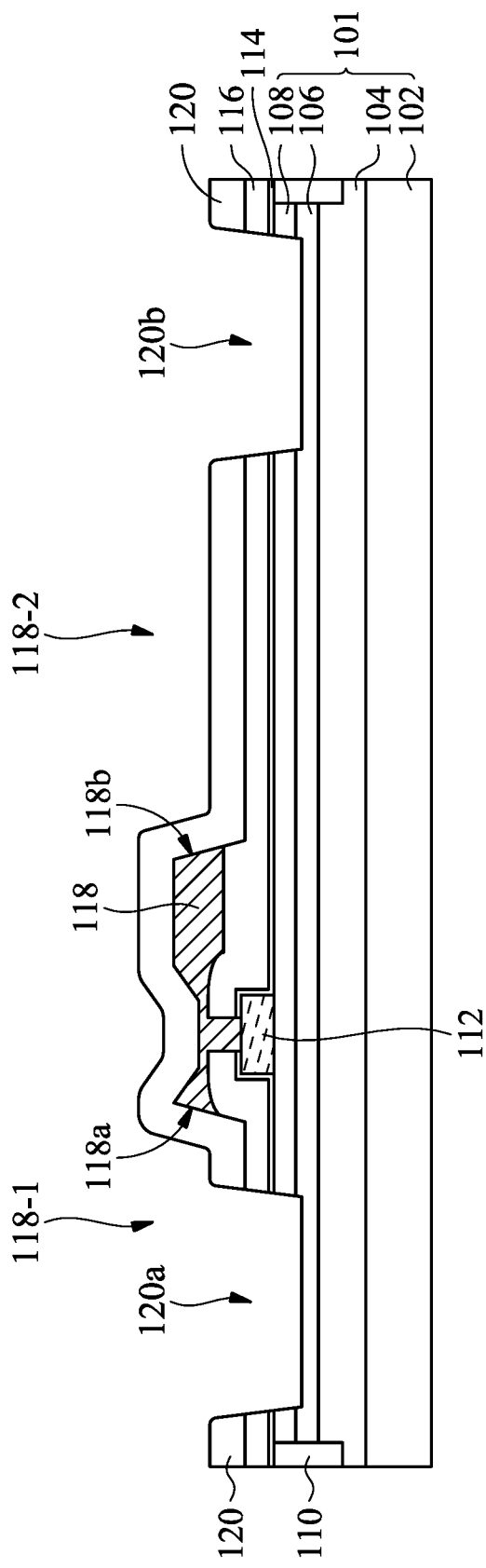
FIG. 2 is a cross-sectional view illustrating the semiconductor device at one stage of manufacture in accordance with some embodiments of the present disclosure.

As shown in FIG. 2, a dielectric layer 120 may formed on the semiconductor layer 101 and the gate electrode 118. In some embodiments, the dielectric layer 120 may include any suitable dielectric material, such as silicon oxide, silicon nitride, silicon oxynitride, low-κ dielectric material, aluminum oxide, aluminum nitride, the like, or a combination thereof, but the present disclosure is not limited thereto. In some embodiments, the dielectric layer 120 may be formed by a deposition process, such as a CVD process, an ALD process, a spin coating process, the like, or a combination thereof, but the present disclosure is not limited thereto. In the embodiments of the present disclosure, the dielectric layer 120 may not be subjected to a planarization process, so that the dielectric layer 120 may be conformally formed on the gate electrode 118.

Then, a patterning process may be performed on the dielectric layer 120 to form a through hole 120a and a through hole 120b respectively on the first side 118-1 and the second side 118-2 of the gate electrode 118. The example of the patterning process is as described above, and will not be repeated again.

Figure 3:
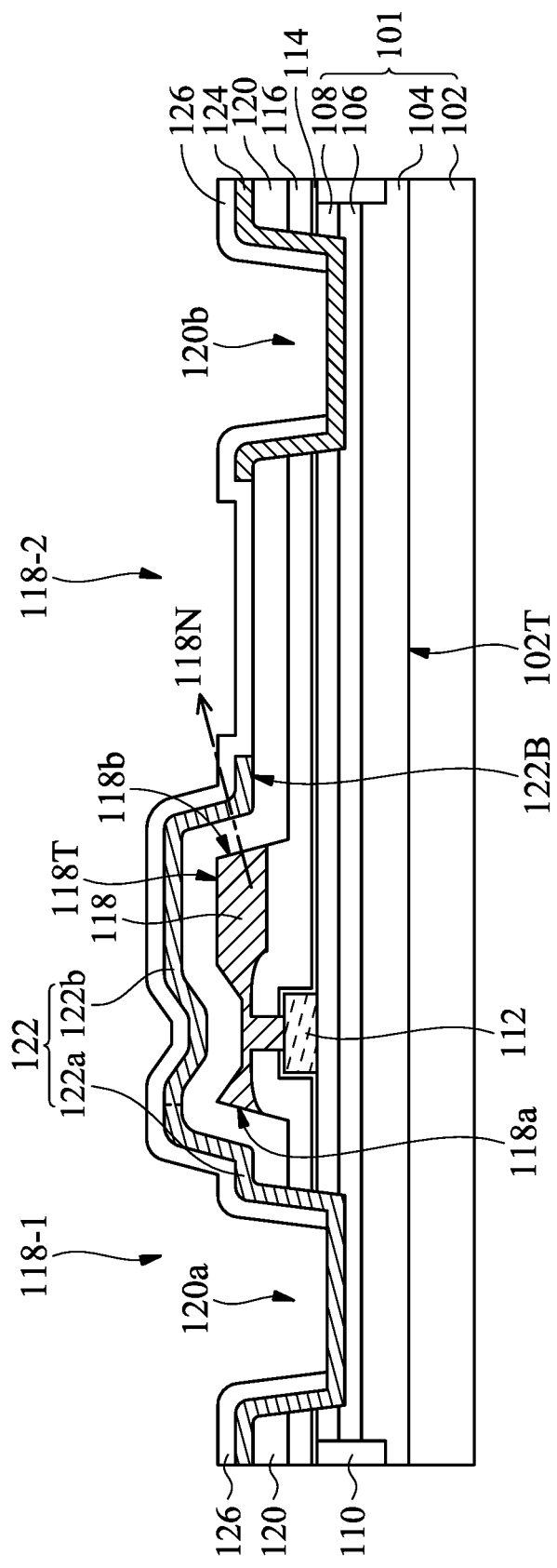
FIG. 3 is a cross-sectional view illustrating the semiconductor device at one stage of manufacture in accordance with some embodiments of the present disclosure.

As shown in FIG. 3, a source field plate 122 and a conductive layer 124 may be conformally formed on the semiconductor layer 101 and the dielectric layer 120. In some embodiments, a conductive material layer may be formed on by a deposition process, and the conductive material layer may be etched to form the source field plate 122 and the conductive layer 124 simultaneously, but the present disclosure is not limited thereto. In some embodiments, the source field plate 122 and the conductive layer 124 may also be formed separately through different processes. Examples of conductive materials, deposition processes, and etching processes are described above and will not be repeated again. In some embodiments, the source field plate 122 and the conductive layer 124 are separated from each other, thereby reducing the risk of shorting between the source field plate 122 and the conductive layer 124. In the embodiments of the present disclosure, the source field plate 122 and the conductive layer 124 may not be subjected to a planarization process, so that the source field plate 122 and the conductive layer 124 may be conformally formed on the semiconductor layer 101 and the dielectric layer 120.

In some embodiments, the source field plate 122 may be formed in the through hole 120a and the conductive layer 124 may be formed in the through hole 120b, and the source field plate 122 may extend from the first side 118-1 to the second side 118-2 of the gate electrode 118. As shown in FIG. 3, a portion of the source field plate 122 is disposed to correspond to the second sidewall 118b of the gate electrode 118. In other words, the portion of the source field plate 122 is stacked on the second sidewall 118b of the gate electrode 118 in the normal direction 118N of the second sidewall 118b.

In more detail, the source field plate 122 may have a first body portion 122a and a first extending portion 122b. The first body portion 122a is disposed on the first side 118-1 of the gate electrode 118, the first extending portion 122b is disposed on the dielectric layer 120 and connected to the first body portion 122b, the first extending portion 122b extends from the top portion of the gate electrode 118 to the second side 118-2 of the gate electrode 118, and a portion of the first extending portion 122b is disposed to correspond to the second sidewall 118b of the gate electrode. In other words, the portion of the first extending portion 122b is stacked on the second sidewall 118b of the gate electrode 118 in the normal direction 118N of the second sidewall 118b.

As shown in FIG. 3, in some embodiments, the bottommost surface 122B of the portion of the source field plate 122 which is disposed to correspond to the second sidewall 118b of the gate electrode 118 (i.e., the bottommost surface 122B of the first extending portion 122b of the source field plate 122) may be lower than the topmost surface 118T of the gate electrode 118. That is, the shortest distance between the bottommost surface 122B of the first extending portion 122b and the top surface 102T of the substrate 102 may be less than the shortest distance between the topmost surface 118T of the gate electrode 118 and the top surface 102T of the substrate 102, but the present disclosure is not limited thereto. Based on the foregoing structural design, when the material of the source field plate 122 includes metal, such as aluminum (Al), copper (Cu), iron (Fe), nickel-iron (NiFe) alloy, beryllium-copper (BeCu) alloy, the like, or a combination thereof, the source field plate 122 may effectively shield the electric field around gate electrode 118 to reduce electromagnetic interference (EMI).

Then, a dielectric layer 126 may be conformally formed on the source field plate 122, the conductive layer 124 and the dielectric layer 120. In some embodiments, the dielectric layer 126 may be formed by a deposition process, and the material and formation of the dielectric layer 126 may be selected from the materials and formation of the dielectric layer 120 as described above. Then, in some embodiments, the dielectric layer 126 is patterned to form the through hole 120a and the through hole 120b again, which expose the source field plate 122 and the conductive layer 124, respectively. The examples of the patterning process are as described above, and will not be repeated again. In the embodiments of the present disclosure, the dielectric layer 126 may not be subjected to a planarization process, so that the dielectric layer 126 may be conformally formed on the source field plate 122, the conductive layer 124 and the dielectric layer 120.

Figure 4:
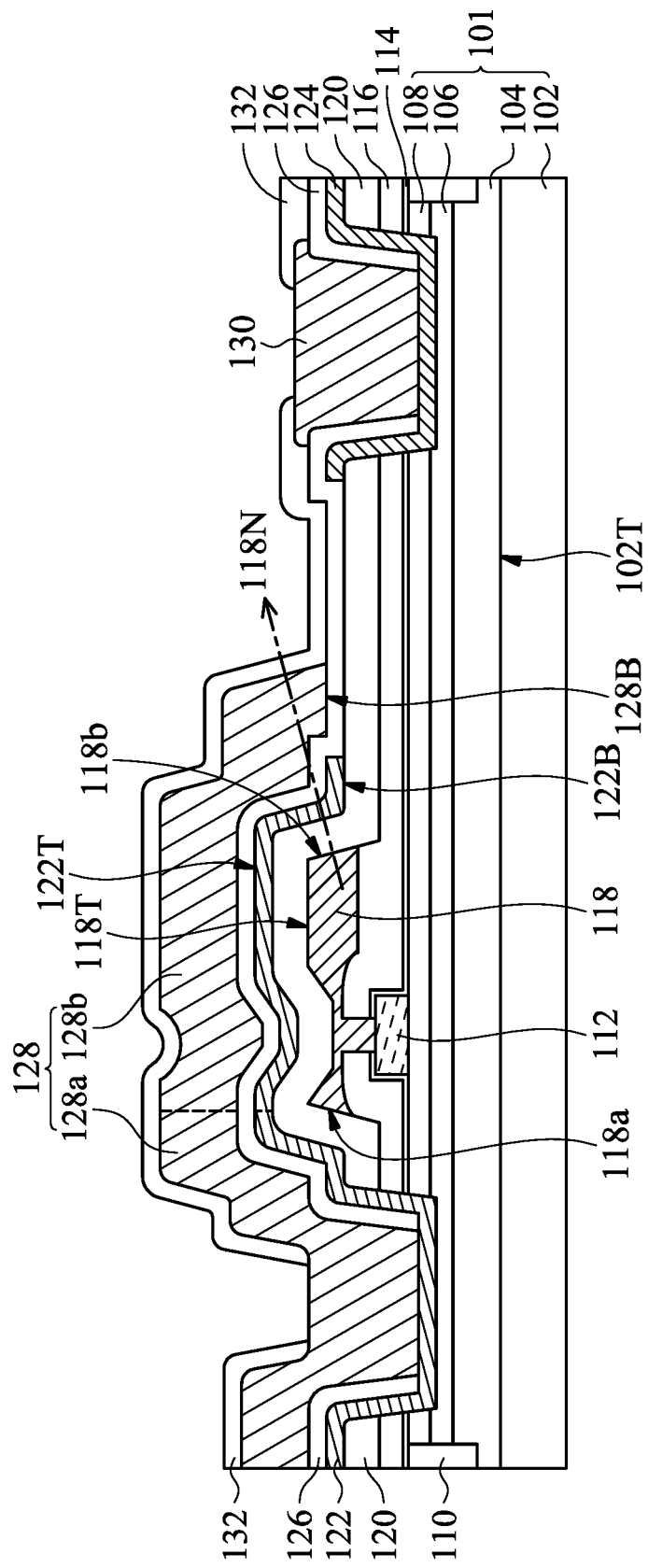
FIG. 4 is a cross-sectional view illustrating the semiconductor device at one stage of manufacture in accordance with some embodiments of the present disclosure.

As shown in FIG. 4, a source electrode 128 and a drain electrode 130 may be formed on the dielectric layer 126. In some embodiments, a conductive material layer may be formed on the dielectric layer 126 by a deposition process, and the conductive material layer may be patterned to form the source electrode 128 and the drain electrode 130. In some embodiments, the source electrode 128 and the drain electrode 130 are electrically connected to the source field plate 122 and the conductive layer 123 via the through hole 120a and the through hole 120b, respectively. Examples of conductive materials, deposition processes, and patterning processes are described above, and will not be repeated again. In the embodiments of the present disclosure, the source electrode 128 and the drain electrode 130 may not be subjected to a planarization process, so that the source electrode 128 and the drain electrode 130 may be conformally formed on the dielectric layer 126.

In some embodiments, the source electrode 128 extends from the first side 118-1 to the second side 118-2 of the gate electrode 118. As shown in FIG. 4, a portion of the source electrode 128 is disposed to correspond to the second sidewall 118b of the gate electrode 118. In other words, the portion of the source electrode 128 is stacked on the second sidewall 118b of the gate electrode 118 in the normal direction 118N of the second sidewall 118b.

In more detail, the source electrode 128 may have a second body portion 128a and a second extending portion 128b, the second body portion 128a is disposed on the first body portion 122a, the second extending portion 128b is connected to the second body portion 128a and extends from the top portion of the gate electrode 118 to the second side 118-2 of the gate electrode 118, and a portion of the second extending portion 128b is disposed to correspond to the second sidewall 118b of the gate electrode 118. In other words, the portion of the second extending portion 128b is stacked on the second sidewall 118b of the gate electrode 118 in the normal direction 118N of the second sidewall 118b.

As shown in FIG. 4, in some embodiments, the bottommost surface 128B of the portion of the source electrode 128 which is disposed to correspond to the second sidewall 118b of the gate electrode 118 (i.e., the bottommost surface 128B of the second extending portion 128b of the source electrode 128) may be lower than the topmost surface 122T of the source field plate 122. That is, the shortest distance between the bottommost surface 128B of the second extending portion 128b and the top surface 102T of the substrate 102 may be less than the shortest distance between the topmost surface 122T of the source field plate 122 and the top surface 102T of the substrate 102, but the present disclosure is not limited thereto. Based on the foregoing structural design, when the material of the source electrode 128 includes metal, such as aluminum (Al), copper (Cu), iron (Fe), nickel-iron (NiFe) alloy, beryllium-copper (BeCu) alloy, the like, or a combination thereof, the source electrode 128 may effectively shield the electric field around gate electrode 118 to reduce electromagnetic interference (EMI).

As shown in FIG. 4, in some embodiments, the bottommost surface 128B of the portion of the source electrode 128 which is disposed to correspond to the second sidewall 118b of the gate electrode 118 (i.e., the bottommost surface 128B of the second extending portion 128b of the source electrode 128) may be lower than the topmost surface 118T of the gate electrode 118. That is, the shortest distance between the bottommost surface 128B of the second extending portion 128b and the top surface 102T of the substrate 102 may be less than the shortest distance between the topmost surface 118T of the gate electrode 118 and the top surface 102T of the substrate 102, but the present disclosure is not limited thereto. Based on the foregoing structural design, when the material of the source electrode 128 includes metal, such as aluminum (Al), copper (Cu), iron (Fe), nickel-iron (NiFe) alloy, beryllium-copper (BeCu) alloy, the like, or a combination thereof, the source electrode 128 may effectively shield the electric field around gate electrode 118 to reduce electromagnetic interference (EMI).

Then, a dielectric layer 132 may be conformally formed on the source electrode 128, the drain electrode 130 and the dielectric layer 126. In some embodiments, the dielectric layer 132 may be formed by a deposition process, and the material and formation of the dielectric layer 132 may be selected from the materials and formation of the dielectric layer 120 or the dielectric layer 126 as described above. Then, in some embodiments, the dielectric layer 132 may be patterned to expose the source electrode 128 and the drain electrode 130. The examples of the patterning process are as described above, and will not be repeated again. In the embodiments of the present disclosure, the dielectric layer 132 may not be subjected to a planarization process, so that the dielectric layer 132 may be conformally formed on the source electrode 128, the drain electrode 130 and the dielectric layer 126.

Figure 5:
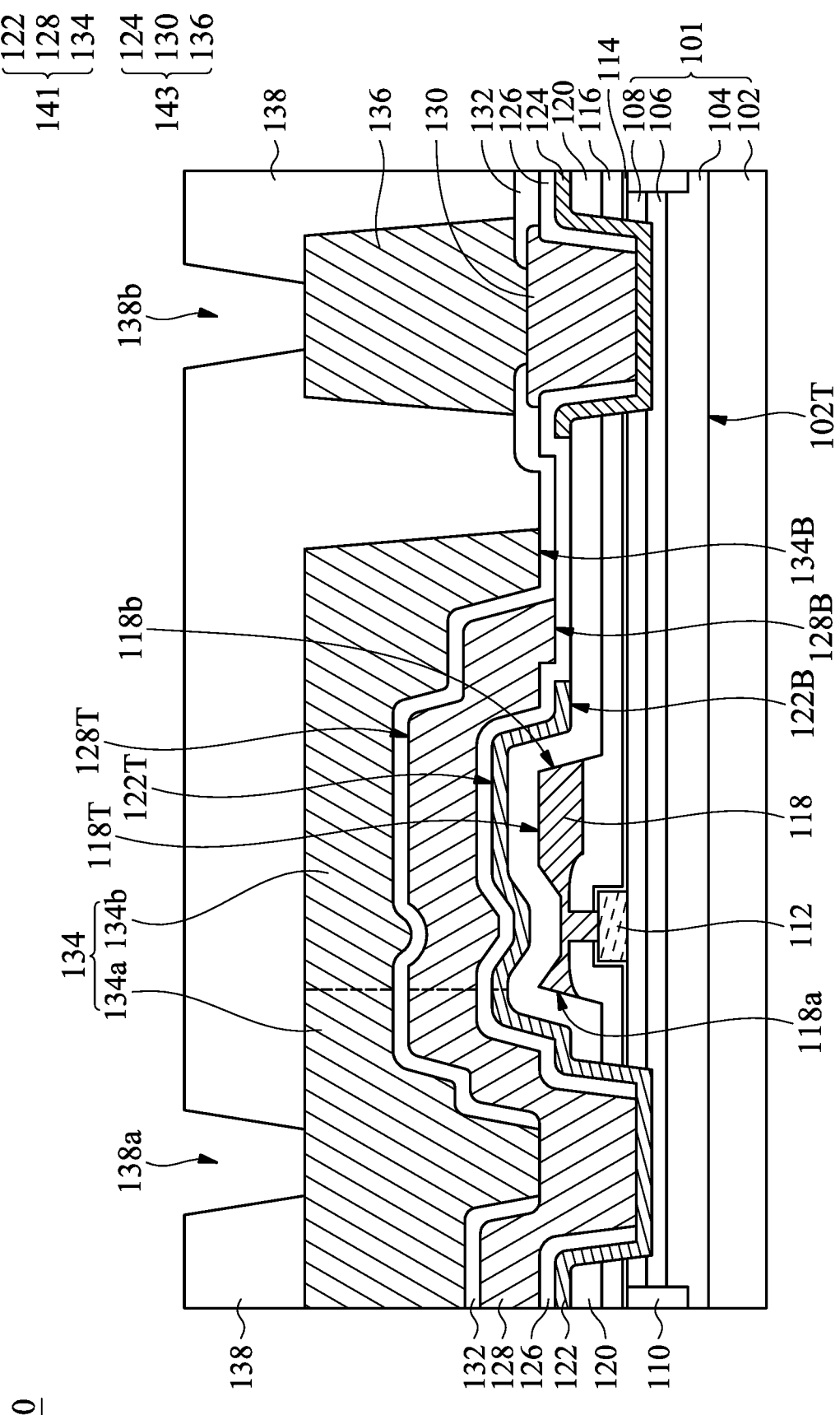
FIG. 5 is a cross-sectional view illustrating the semiconductor device at one stage of manufacture in accordance with some embodiments of the present disclosure.

As shown in FIG. 5, a source contact 134 and a drain contact 136 may be formed on the dielectric layer 132 to form the semiconductor device 100. In some embodiments, a conductive material layer may be formed on the dielectric layer 132 by a deposition process, and the conductive material layer may be patterned to form the source contact 134 and the drain contact 136. In some embodiments, the source contact 134 and the drain contact 136 are electrically connected to the source electrode 132 and the drain electrode 134, respectively. Examples of conductive materials, deposition processes, and patterning processes are described above and will not be repeated again. For simplicity, the source field plate 122, the source electrode 128, and the source contact 134 may be collectively referred to as a source structure 141, and the conductive layer 124, the drain electrode 130, and the drain contact 136 may be collectively referred to as a drain structure 143.

In some embodiment, the drain structure 143 may be disposed on the second side 118-2 (not labeled in FIG. 5) of the gate electrode 118. In some embodiments, the conductive layer 124 may be disposed on the dielectric layer 120 and the semiconductor layer 101, the drain electrode 130 may be disposed on the conductive layer 124 and electrically connected to the conductive layer 124, and the drain contact 136 may be disposed on the drain electrode 130 and electrically connected to the drain electrode 130, but the present disclosure is not limited thereto.

In some embodiments, the source contact 134 may extend from the first side 118-1 to the second side 118-2 of the gate electrode 118. As shown in FIG. 5, a portion of the source contact 134 is disposed to correspond to the second sidewall 118b of the gate electrode 118. In other words, the portion of the source contact 134 is stacked on the second sidewall 118b (not labeled in FIG. 5) of the gate electrode 118 in the normal direction 118N of the second sidewall 118b.

In more detail, the source contact 134 may have a third body portion 134a and a third extending portion 134b, the third body portion 134a is disposed on the second body portion 128a, the third extending portion 134b is connected to the third body portion 134a and extends from the top portion of the gate electrode 118 to the second side 118-2 of the gate electrode 118, and a portion of the third extending portion 134b is disposed to correspond to the second sidewall 118b of the gate electrode 118. In other words, the portion of the third extending portion 134b is stacked on the second sidewall 118b of the gate electrode 118 in the normal direction 118N of the second sidewall 118b.

As shown in FIG. 5, in some embodiments, the bottommost surface 134B of the portion of the source contact 134 which is disposed to correspond to the second sidewall 118b of the gate electrode 118 (i.e., the bottommost surface 134B of the third extending portion 134b of the source contact 134) may be lower than the topmost surface 128T of the source electrode 128. That is, the shortest distance between the bottommost surface 134B of the third extending portion 134b and the top surface 102T of the substrate 102 may be less than the shortest distance between the topmost surface 128T of the source electrode 128 and the top surface 102T of the substrate 102, but the present disclosure is not limited thereto. Based on the foregoing structural design, when the material of the source contact 134 includes metal, such as aluminum (Al), copper (Cu), iron (Fe), nickel-iron (NiFe) alloy, beryllium-copper (BeCu) alloy, the like, or a combination thereof, the source contact 134 may effectively shield the electric field around gate electrode 118 to reduce electromagnetic interference (EMI).

As shown in FIG. 5, in some embodiments, the bottommost surface 134B of the portion of the source contact 134 which is disposed to correspond to the second sidewall 118b of the gate electrode 118 (i.e., the bottommost surface 134B of the third extending portion 134b of the source contact 134) may be lower than the topmost surface 122T of the source field plate 122. That is, the shortest distance between the bottommost surface 134B of the third extending portion 134b and the top surface 102T of the substrate 102 may be less than the shortest distance between the topmost surface 122T of the source field plate 122 and the top surface 102T of the substrate 102, but the present disclosure is not limited thereto. Based on the foregoing structural design, when the material of the source contact 134 includes metal, such as aluminum (Al), copper (Cu), iron (Fe), nickel-iron (NiFe) alloy, beryllium-copper (BeCu) alloy, the like, or a combination thereof, the source contact 134 may effectively shield the electric field around gate electrode 118 to reduce electromagnetic interference (EMI).

In some embodiments, the bottommost surface 134B of the portion of the source contact 134 which is disposed to correspond to the second sidewall 118b of the gate electrode 118 (i.e., the bottommost surface 134B of the third extending portion 134b of the source contact 134) may be lower than the topmost surface 118T of the gate electrode 118. That is, the shortest distance between the bottommost surface 134B of the third extending portion 134b and the top surface 102T of the substrate 102 may be less than the shortest distance between the topmost surface 118T of the gate electrode 118 and the top surface 102T of the substrate 102, but the present disclosure is not limited thereto. Based on the foregoing structural design, when the material of the source contact 134 includes metal, such as aluminum (Al), copper (Cu), iron (Fe), nickel-iron (NiFe) alloy, beryllium-copper (BeCu) alloy, the like, or a combination thereof, the source contact 134 may effectively shield the electric field around gate electrode 118 to reduce electromagnetic interference (EMI).

Then, a protective layer 138 may be formed on the source contact 134 and the drain contact 136 to block moisture, for example. In some embodiments, the protective layer 138 may include any suitable dielectric material such as silicon oxide, silicon nitride, silicon oxynitride, low-κ dielectric material, aluminum oxide, aluminum nitride, the like, or a combination thereof, but the present disclosure is not limited thereto. In some embodiments, the protective layer 138 may be formed by a deposition process, such as a CVD process, an ALD process, a spin coating process, the like, or a combination thereof, but the present disclosure is not limited thereto. Then, in some embodiments, the protective layer 138 may be patterned to form an opening 138a and an opening 138b that expose the source contact 134 and the drain contact 136, respectively.

It should be noted that the semiconductor device 100 may not include the source contact 134, the drain contact 136 and the protective layer 138 in some embodiments, which may be determined according to actual needs.

According to the embodiments of the present disclosure, in the off state, the semiconductor device 100 (e.g., high electron mobility transistor) may generate leakage current, and the leakage current may be trapped by the interface when flowing through the interface. Since the source field plate 122 extends from the first side 118-1 to the second side 118-2 of the gate electrode 118 and the portion of the source field plate 122 is disposed to correspond to the second sidewall 118b of the gate electrode 118, a voltage of 0V or less (negative voltage, e.g., a voltage opposite to the voltage in the on state, such as −3V to −20V) may be applied to the gate electrode 118 when the semiconductor device 100 is in the off state, so that the displacement of the electric field may be generated (e.g., toward the drain structure 143), but the present disclosure is not limited thereto. For example, when the semiconductor device 100 is applied with a voltage of +6 V to the gate electrode 118 in the on state, a voltage of −6 V may be applied to the gate electrode 118 in the off state. Therefore, the charge accumulated by the interface trap may be derived through the source field plate 122 or the drain structure 143, thereby effectively improving the problem of charge trapping and improving the performance of the semiconductor device 100.

Similarly, since the source electrode 128 (or the source contact 134) extends from the first side 118-1 to the second side 118-2 of the gate electrode 118 and the portion of the source electrode 128 (or a portion of the source contact 134) is disposed to correspond to the second sidewall 118b of the gate electrode 118, a voltage of 0V or less (negative voltage) may be applied to the gate electrode 118 when the semiconductor device 100 is in the off state, so that the displacement of the electric field may be generated (e.g., toward the drain structure 143). Therefore, the charge accumulated by the interface trap may be derived through the source electrode 128 (or the source contact 134) or the drain structure 143, thereby effectively improving the problem of charge trapping and improving the performance of the semiconductor device 100.

Furthermore, according to the embodiments of the present disclosure as shown in FIG. 3 to FIG. 5, the source field plate 122, the source electrode 128 or the source contact 134 may extend from the first side 118-1 to the second side 118-2 of the gate electrode 118, and the portion of the source field plate 122, the portion of the source electrode 128 or the portion of the source contact 134 may be disposed to correspond to the second sidewall 118b of the gate electrode 118, which may effectively shield the electric field from gate electrode 118 to reduce electromagnetic interference (EMI).

In summary, in the semiconductor device of the embodiments according to the present disclosure, the source field plate, the source electrode or the source contact may respectively have extending portions. The extending portions may extend between the gate electrode and the drain structure, which may effectively shield the electric field from electromagnetic interference (EMI), improve the problem of charge trapping, and improve the performance of the semiconductor device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A semiconductor device, comprising: a semiconductor layer; a gate electrode disposed on the semiconductor layer, wherein the gate electrode has a first sidewall and a second sidewall respectively disposed on a first side and a second side of the gate electrode; a first dielectric layer disposed on the semiconductor layer and the gate electrode; a source field plate disposed on the semiconductor layer and the first dielectric layer, wherein the source field plate extends from the first side to the second side of the gate electrode and a portion of the source field plate is disposed to correspond to the second sidewall; a second dielectric layer disposed on the source field plate; a source electrode disposed on the second dielectric layer and electrically connected to the source field plate through the second dielectric layer; a third dielectric layer disposed on the source electrode; and a drain structure disposed on the second side of the gate electrode.

2. The semiconductor device as claimed in claim 1, wherein a bottommost surface of the portion of the source field plate which is disposed to correspond to the second sidewall is lower than a topmost surface of the gate electrode.

3. The semiconductor device as claimed in claim 1, wherein the source electrode extends from the first side to the second side of the gate electrode, and a portion of the source electrode is disposed to correspond to the second sidewall.

4. The semiconductor device as claimed in claim 3, wherein a bottommost surface of the portion of the source electrode which is disposed to correspond to the second sidewall is lower than a topmost surface of the source field plate.

5. The semiconductor device as claimed in claim 3, wherein a bottommost surface of the portion of the source electrode which is disposed to correspond to the second sidewall is lower than a topmost surface of the gate electrode.

6. The semiconductor device as claimed in claim 1, further comprising:
a source contact disposed on the third dielectric layer and electrically connected to the source electrode.

7. The semiconductor device as claimed in claim 6, wherein the source contact extends from the first side to the second side of the gate electrode, and a portion of the source contact is disposed to correspond to the second sidewall.

8. The semiconductor device as claimed in claim 7, wherein a bottommost surface of the portion of the source contact which is disposed to correspond to the second sidewall is lower than a topmost surface of the gate electrode.

9. The semiconductor device as claimed in claim 6, wherein materials of the source field plate, the source electrode and the source contact include aluminum, copper, iron, nickel-iron alloy, beryllium-copper alloy or a combination thereof.

10. A semiconductor device, comprising: a semiconductor layer; a gate electrode disposed on the semiconductor layer, wherein the gate electrode has a first sidewall and a second sidewall respectively disposed on a first side and a second side of the gate electrode; a first dielectric layer disposed on the semiconductor layer and the gate electrode; a source field plate having a first body portion and a first extending portion, wherein the first body portion is disposed on the first side of the gate electrode, the first extending portion is disposed on the first dielectric layer and connected to the first body portion, the first extending portion extends from a top portion of the gate electrode to the second side of the gate electrode, and a portion of the first extending portion is disposed to correspond to the second sidewall; a second dielectric layer disposed on the source field plate; a source electrode disposed on the second dielectric layer and electrically connected to the source field plate through the second dielectric layer; a third dielectric layer disposed on the source electrode; and a drain structure disposed on the second side of the gate electrode.

11. The semiconductor device as claimed in claim 10, wherein a bottommost surface of the first extending portion is lower than a topmost surface of the gate electrode.

12. The semiconductor device as claimed in claim 10, wherein the source electrode has a second body portion and a second extending portion, the second body portion is disposed on the first body portion, the second extending portion is connected to the second body portion and extends from the top portion of the gate electrode to the second side of the gate electrode, and a portion of the second extending portion is disposed to correspond to the second sidewall.

13. The semiconductor device as claimed in claim 12, wherein a bottommost surface of the second extending portion is lower than a topmost surface of the first extending portion.

14. The semiconductor device as claimed in claim 12, wherein a bottommost surface of the second extending portion is lower than a topmost surface of the gate electrode.

15. The semiconductor device as claimed in claim 12, further comprising:
a source contact disposed on the third dielectric layer and electrically connected to the source electrode.

16. The semiconductor device as claimed in claim 15, wherein the source contact has a third body portion and a third extending portion, the third body portion is disposed on the second body portion, the third extending portion is connected to the third body portion and extends from the top portion of the gate electrode to the second side of the gate electrode, and a portion of the third extending portion is disposed to correspond to the second sidewall.

17. The semiconductor device as claimed in claim 16, wherein a bottommost surface of the third extending portion is lower than a topmost surface of the second extending portion.

18. The semiconductor device as claimed in claim 15, wherein materials of the source field plate, the source electrode and the source contact comprise aluminum, copper, iron, nickel-iron alloy, beryllium-copper alloy or a combination thereof.

19. An operating method of a semiconductor device, wherein the semiconductor device comprises: a semiconductor layer; a gate electrode disposed on the semiconductor layer, wherein the gate electrode has a first sidewall and a second sidewall respectively disposed on a first side and a second side of the gate electrode; a first dielectric layer disposed on the semiconductor layer and the gate electrode; a source field plate disposed on the semiconductor layer and the first dielectric layer, wherein the source field plate extends from the first side to the second side of the gate electrode and a portion of the source field plate is disposed to correspond to the second sidewall; a second dielectric layer disposed on the source field plate; a source electrode disposed on the second dielectric layer and electrically connected to the source field plate through the second dielectric layer; a third dielectric layer disposed on the source electrode; and a drain structure disposed on the second side of the gate electrode; wherein the operating method comprises: applying a voltage of OV or less to the gate electrode when the semiconductor device is in an off state.

20. The operating method of the semiconductor device as claimed in claim 19, wherein when the semiconductor device is in the off state, a voltage opposite to a voltage of the semiconductor device in an on state is applied to the gate electrode.

\* \* \* \* \*